United States Patent
Nakamura et al.

(10) Patent No.: US 12,119,609 B2
(45) Date of Patent: *Oct. 15, 2024

(54) HIGH INTENSITY PULSE LASER GENERATION SYSTEM AND METHOD

(71) Applicant: Blue Laser Fusion, Inc., Palo Alto, CA (US)

(72) Inventors: Shuji Nakamura, Palo Alto, CA (US); Hiroaki Ohta, Palo Alto, CA (US)

(73) Assignee: BLUE LASER FUSION, INC., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/463,058

(22) Filed: Sep. 7, 2023

(65) Prior Publication Data

US 2024/0213736 A1 Jun. 27, 2024

Related U.S. Application Data

(63) Continuation of application No. 18/087,695, filed on Dec. 22, 2022, now Pat. No. 11,784,454.

(51) Int. Cl.
*H01S 5/00* (2006.01)
*G21B 1/23* (2006.01)
(Continued)

(52) U.S. Cl.
CPC ........... *H01S 5/0085* (2013.01); *G21B 1/23* (2013.01); *H01S 5/0071* (2013.01); *H01S 5/10* (2013.01); *H01S 5/3235* (2013.01); *H02N 2/028* (2013.01)

(58) Field of Classification Search
CPC ..................................................... H02N 2/028
(Continued)

(56) References Cited

U.S. PATENT DOCUMENTS 5,168,400 A 12/1992 Moses
8,208,508 B2 6/2012 Deri et al.
(Continued)

FOREIGN PATENT DOCUMENTS

WO 2011029031 A1 3/2011
WO 2012064767 A1 5/2012
(Continued)

OTHER PUBLICATIONS

Peter Russbueldt et al., "Innoslab Amplifiers", IEEE Journal of Selected Topics in Quantum Electronics, Jan./Feb. 2015, vol. 21, No. 1, pp. 447-463, Art No. 3100117, doi: 10.1109/JSTQE.2014.2333234.

(Continued)

*Primary Examiner* — Tuan N Nguyen
(74) *Attorney, Agent, or Firm* — Richard T. Ogawa; Ogawa P.C.

(57) ABSTRACT

In an example, the present invention provides a high intensity pulse laser generation system. The system has a variety of elements. The system has an optical cavity maintained in a vacuum, e.g., 300 Torr and less. In an example, the optical cavity is configured to increase an intensity of a laser beam comprising a pulse from a first energy power intensity to a second higher energy power intensity propagating on a first optical path configured within the optical cavity by circulating or reciprocating at least a portion of the laser beam.

20 Claims, 11 Drawing Sheets

(51) Int. Cl.
*H01S 5/10* (2021.01)
*H01S 5/323* (2006.01)
*H02N 2/02* (2006.01)

(58) Field of Classification Search
USPC .................................................. 359/221.2
See application file for complete search history.

(56) References Cited

U.S. PATENT DOCUMENTS

| | | | |
|---|---|---|---|
| 9,171,646 | B2 | 10/2015 | Moses et al. |
| 10,410,752 | B2 | 9/2019 | Hora |
| 10,476,226 | B2 | 11/2019 | Bayramian et al. |
| 10,660,192 | B2 | 5/2020 | Campbell et al. |
| 11,387,007 | B2 | 7/2022 | Moses et al. |
| 2003/0002610 | A1 | 1/2003 | Panarella |
| 2009/0000268 | A1 | 1/2009 | Yurash |
| 2010/0091359 | A1* | 4/2010 | Yamamoto ............ H01S 3/2325 359/347 |
| 2011/0235669 | A1 | 9/2011 | Deri et al. |
| 2011/0261919 | A1 | 10/2011 | Sefcik et al. |
| 2013/0064340 | A1 | 3/2013 | Latkowski et al. |
| 2014/0138359 | A1 | 5/2014 | Carr et al. |
| 2014/0348283 | A1 | 11/2014 | Perkins et al. |
| 2018/0211732 | A1 | 7/2018 | Perkins |

FOREIGN PATENT DOCUMENTS

| | | |
|---|---|---|
| WO | 2013070683 A1 | 5/2013 |
| WO | 2013133885 A1 | 9/2013 |
| WO | 2013165469 A2 | 11/2013 |
| WO | 2014113100 A2 | 7/2014 |
| WO | 2014130127 A2 | 8/2014 |
| WO | 2014160128 A1 | 10/2014 |
| WO | 2015021403 A1 | 2/2015 |

OTHER PUBLICATIONS

Y. Hosaka et al., "Mode-locked pulse oscillation of a self-resonating enhancement optical cavity" Journal of Physics: Conference Series. 1350. 10.1088/1742-6596/1350/1/012028, Oct. 2016.

* cited by examiner

Figure 1A

| Materials | Giant magnetostrictive materials | | Piezo materials |
|---|---|---|---|
| | $Tb_{0.3}Dy_{0.7}Fe_{1.9}$ | $SmFe_2$ | |
| expansion coefficient $\Delta l/l$ [ppm] (at magnetic field = 1 kOe) | 1,500 | ~750 | 800 |
| Sound speed [m/sec] | 2,200 | 2,500 | - |
| Induced stress [kg/cm²] | 300 | 240 | 150 |
| Curie temperature [degrees Celsius] | 380±40 | 405 | 180±100 |
| Response time | nanosecond~ millisecond | | ~millisecond |

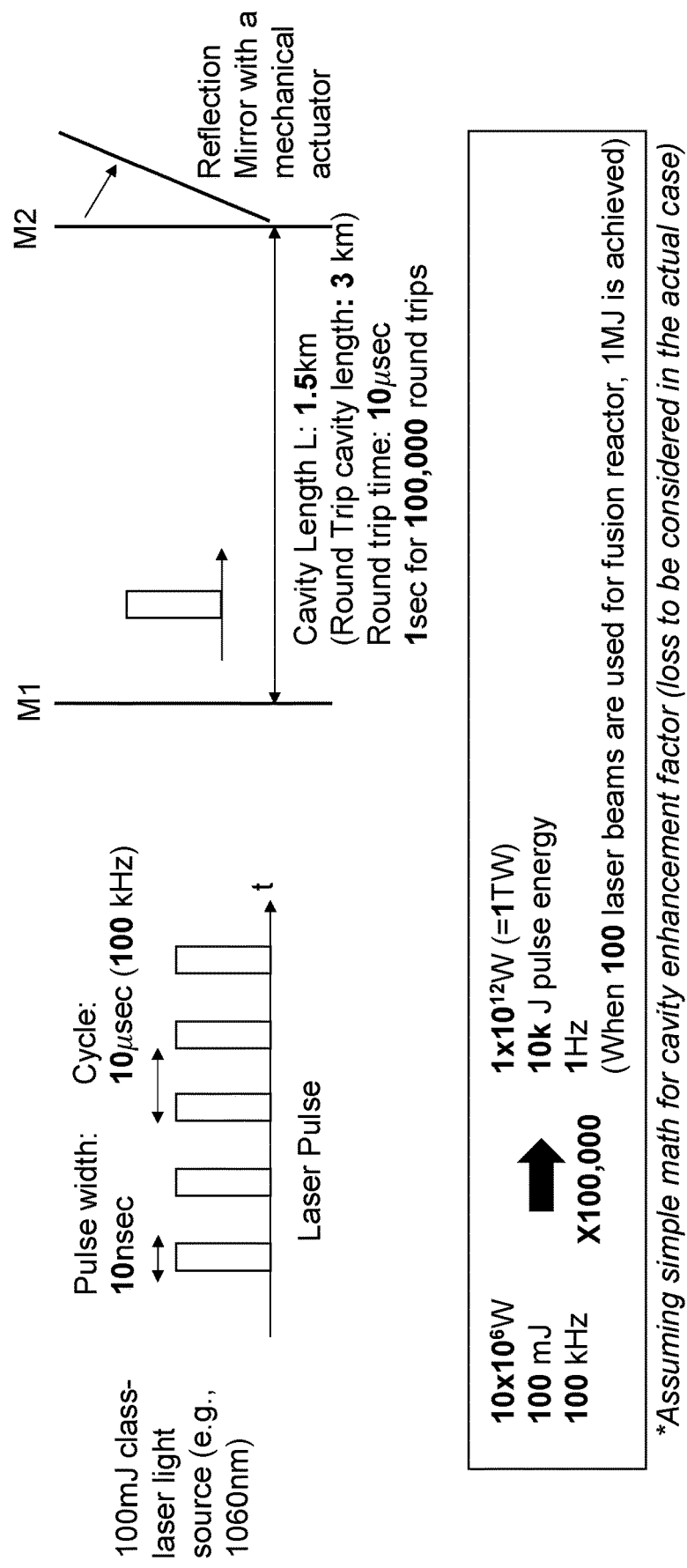

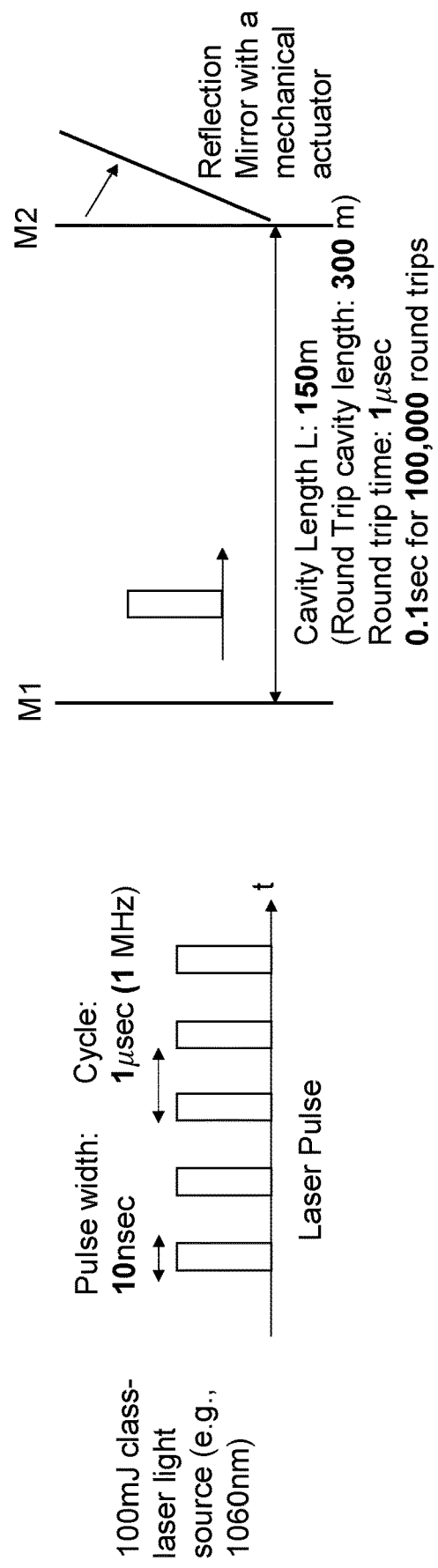

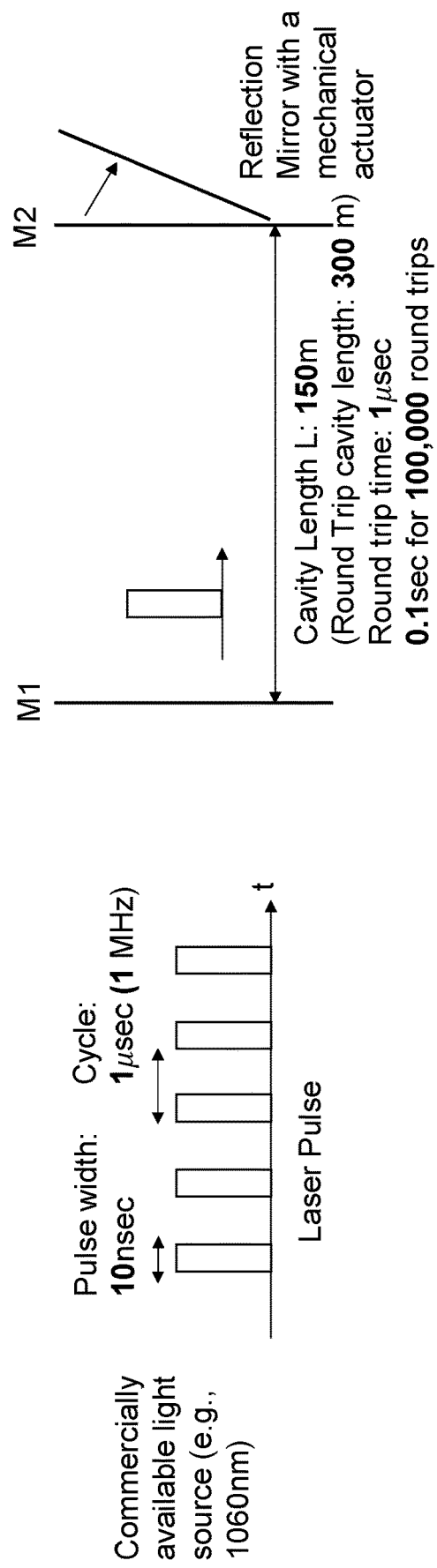

HIGH INTENSITY PULSE LASER GENERATION SYSTEM AND METHOD

CROSS REFERENCE TO RELATED APPLICATIONS

This application is a continuation of U.S. patent application Ser. No. 18/087,695, filed on Dec. 22, 2022, which is related to U.S. Provisional Patent Application 63/424,779, filed on Nov. 11, 2022, commonly assigned, and hereby incorporated in its entirety for all purposes.

BACKGROUND OF INVENTION

The present invention relates generally to high intensity pulse laser generation techniques. In particular, the present invention provides a high intensity pulse laser generation system, and related methods. Merely by way of example, the invention can be applied to a variety of applications, including material processing, fabrication, detector and sensing, accelerator (e.g., high power laser pulse for particle acceleration), X-ray or other high energy radiation/particle generation (e.g., laser collision with other particles generating high energy particles), neutron generator though laser fusion reaction, other energy applications (e.g., energy generation for power, space ships, travel, other air, land, and water vehicles), defense applications (e.g., satellite, aerospace, land and missile defense, submarines, boats), biotechnology, chemical, mechanical, electrical, and communication and/or data applications.

From the beginning of time, human beings have developed energy sources from nature such as wood and coal, oil and gas products, the sun, wind, and water. Other renewable energy sources include nuclear, windmills, hydroelectric, and solar. Yet, another example of an energy source is a laser from a laser device. In operation, the laser device emits light through a process of optical amplification based on the stimulated emission of electromagnetic radiation. The term "laser" is generally an acronym for "light amplification by stimulated emission of radiation." The first laser was built in 1960 by Theodore H. Maiman at Hughes Research. More recently, the inventor of the present application, Shuji Nakamura, invented the blue laser diode device, and Hiroaki Ohta, also an inventor of the present application pioneered a laser device using a non-polar configuration of gallium nitride.

Unlike other light sources, a laser emits light which is coherent. Coherence allows a laser beam to focus on a small spot to enable various applications. Such applications include ablation, lighting, laser pointers, communications, and others. Lasers can also have high temporal coherence, which allows them to emit light with a very narrow spectrum. Unfortunately, laser devices have limitations. That is, low power lasers can be used for laser pointers, however, such devices are not good energy sources. High-power lasers can ablate metal and is a good energy source. However, such high-power lasers are often cumbersome, large, and difficult to configure.

From the above, it is still desired to improve laser devices and related systems.

SUMMARY OF INVENTION

According to the present invention, techniques related generally to high intensity pulse laser generation are provided. In particular, the present invention provides a high intensity pulse laser generation system, and related methods. Merely by way of example, the invention can be applied to a variety of applications, including material processing, fabrication, detector and sensing, accelerator (e.g., high power laser pulse for particle acceleration), X-ray or other high energy radiation/particle generation (e.g., laser collision with other particles generating high energy particles), neutron generator though laser fusion reaction, other energy applications (e.g., energy generation for power, space ships, travel, other air, land, and water vehicles), defense applications (e.g., satellite, aerospace, land and missile defense, submarines, boats), biotechnology, chemical, mechanical, electrical, and communication and/or data applications.

In an example, the present invention provides a high intensity pulse laser generation system. The system has a variety of elements. The system has an optical cavity maintained in a vacuum, e.g., 300 Torr and less. The cavity is characterized by a length of free space, e.g., 50 meters to 10 kilometers and others. In an example, the optical cavity is configured to increase an intensity of a laser beam comprising a pulse from a first energy power intensity to a second higher energy power intensity propagating on a first optical path configured within the optical cavity by circulating or reciprocating at least a portion of the laser beam. The laser beam is from a light source having a pulse energy power (e.g., 0.01 Joule to 1 Mega Joule) on the first optical path.

In an example, the system has an optical path modification device coupled to the optical cavity. In an example, the optical path modification device is configured to repeatedly change a spatial direction of the laser beam propagating on the first optical path at a predetermined timing ranging from 20 milliseconds to 3 seconds, for example, with the response time from 0.01 microsecond to 30 microseconds, for example. The change in spatial direction causes the laser beam propagating on the first optical path to change a direction from the first optical path to a second optical path that is outside of the first optical path such that the optical path modification device is configured to propagate the laser beam on the second optical path generating a high intensity pulse laser beam.

In an example, the system has at least a pair of mirror devices. Each of the mirror devices has a mirror surface area, e.g., 1 $cm^2$ to 10000 $cm^2$. The pair of mirror devices are configured with the optical path modification device and provided within the first optical path. At least one the mirror devices is configured to change a spatial position of the mirror device being coupled to the laser beam.

In an example, the system has a timing device configured with the optical path modification device and having a predetermined frequency to adjust the spatial position of the mirror device. The timing device is configured to adjust the spatial position of the mirror device after a predetermined number of cycles associated with the circulating or reciprocating of the laser beam propagating between at least the pair of mirrors such that each cycle of the laser beam progressively increases an intensity from the first energy power intensity to the second energy power intensity to an Nth energy power intensity, where N is an integer greater than 2, to the high intensity pulse laser beam on the second optical path.

In an example, the system has a spatial driver device comprising a magneto-strictive material. The spatial driver device is coupled to the timing device and the one mirror device. The spatial driver device is configured to adjust the spatial position of the mirror device by changing a thickness of a volume structure (e.g., ranging from 0.01 mm to 2 mm) including the magneto-strictive material of the spatial driver device by an expansion or contraction process to move the spatial position of the mirror device from a first position to a second position after the predetermined number of cycles.

Of course, one of ordinary skill in the art would recognize other variations, modifications, and alternatives.

Depending upon the example, the present invention can achieve one or more of these benefits and/or advantages. In an example, the present invention provides a high intensity pulse laser system in a compact and spatially efficient system and related methods. In an example, the present invention offers advantage of size weight and cost reduction for high intensity lasers. In an example, the present invention provides an optical path modification device (e.g., cavity dumper) that is configured with a spatial driver device that is fast, efficient, lightweight, and reliable. These and other benefits and/or advantages are achievable with the present device and related methods. Further details of these benefits and/or advantages can be found throughout the present specification and more particularly below.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIG. 1A is a table listing magneto-strictive and piezo materials according to examples of the present invention.

FIGS. 8 to 10 illustrate timing diagrams showing a high intensity pulse laser output according to examples of the present invention.

DETAILED DESCRIPTION OF THE EXAMPLES

Figure 1:
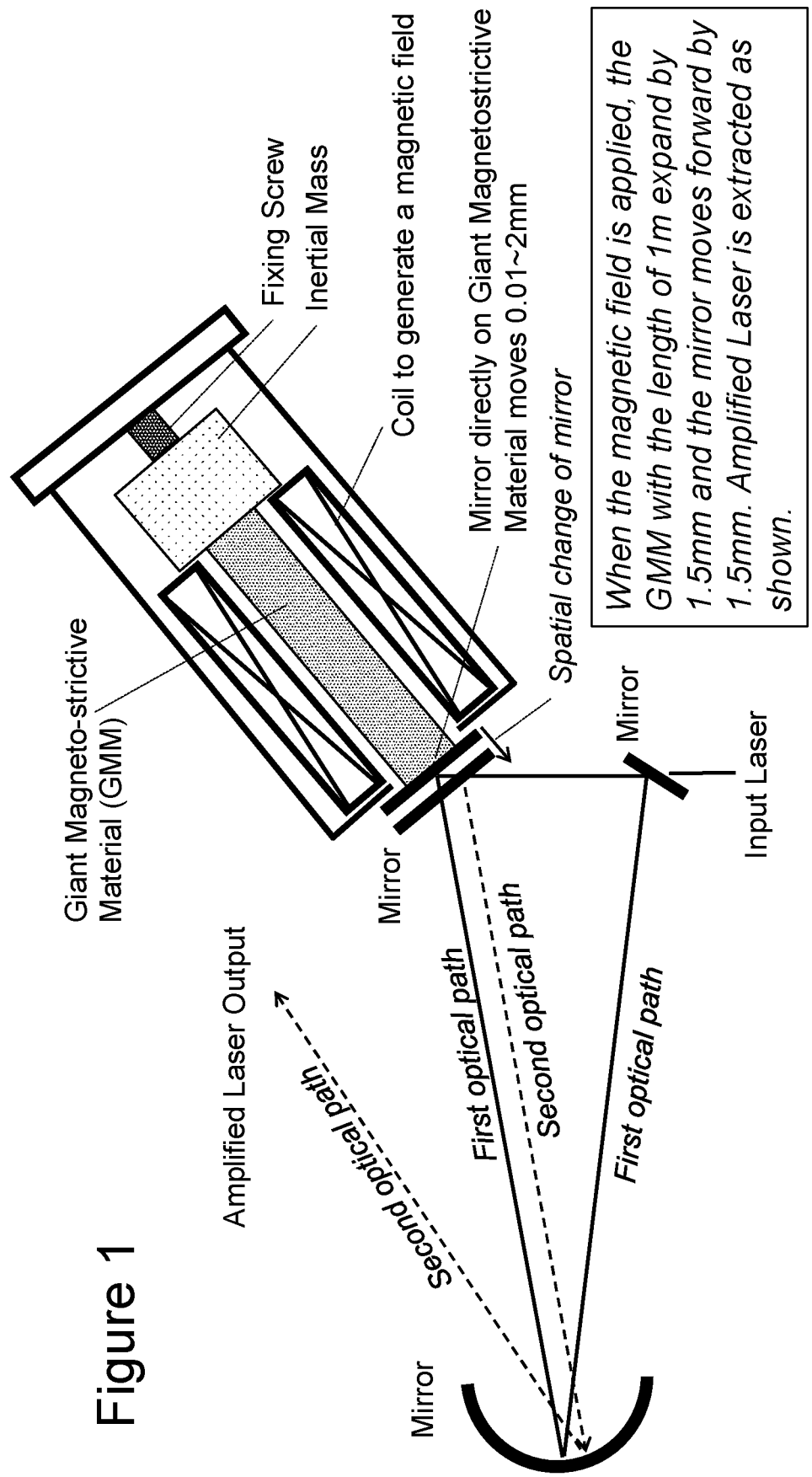
FIG. 1 is a simplified diagram of a high intensity pulse laser generation system according to an example of the present.

In an example, the present invention provides generally high intensity pulse laser generation techniques. In particular, the present invention provides a high intensity pulse laser generation system, and related methods. Merely by way of example, the invention can be applied to a variety of applications, including material processing, fabrication, detector and sensing, accelerator (e.g., high power laser pulse for particle acceleration), X-ray or other high energy radiation/particle generation (e.g., laser collision with other particles generating high energy particles), neutron generator though laser fusion reaction, other energy applications (e.g., energy generation for power or propulsion, space ships, travel, other air, land, and water vehicles), defense applications (e.g., satellite, aerospace, land and missile defense, submarines, boats), biotechnology, chemical, mechanical, electrical, and communication and/or data applications.

As an example, a high power laser is a device that produces a highly concentrated and focused beam of light with a high level of power. The light produced by a high power laser can have a variety of properties, such as wavelength, intensity, and coherence, which depend on the specific design and construction of the laser.

One type of high power laser is the solid-state laser, which is made of a solid gain medium that is pumped by an external energy source, such as a flashlamp or another laser. The gain medium is typically a crystal or glass rod that is doped with a rare earth element, such as neodymium or ytterbium, to amplify the laser beam. Solid-state lasers are highly efficient and can produce high power outputs, making them ideal for many industrial and scientific applications.

Another type of high power laser is the gas laser, which uses a gas as the gain medium. Gas lasers can be further classified based on the type of gas used, such as helium-neon lasers, carbon dioxide lasers, and argon lasers. Gas lasers are highly reliable and have a long lifespan, making them suitable for continuous operation.

A high power laser can also be a hybrid of the two aforementioned types, such as a fiber laser, which uses a doped fiber as the gain medium. Fiber lasers are highly efficient and can produce very high power outputs, making them ideal for many industrial and scientific applications.

There are many factors that contribute to the performance and efficiency of a high power laser, such as the gain medium, pump source, resonator design, and cooling system. The design and construction of a high power laser can greatly impact its performance and suitability for a specific application. As an example, a high power laser is a highly concentrated and focused beam of light with a high level of power, used in a wide range of applications.

In an example, the present invention provides a high intensity pulse laser generation system. In an example, a high intensity pulse laser is a type of laser that produces a highly concentrated and focused beam of light with a high level of power, but with a pulse duration that is much shorter than the average pulse duration of a continuous wave laser. The short pulse duration of a high intensity pulse laser allows for high peak power and the ability to deliver energy to a target in a very short period of time.

In an example, one type of high intensity pulse laser is the Q-switched laser, which uses a mechanical or electro-optical modulator to rapidly switch the laser beam on and off. This allows the laser to produce very short pulses, with pulse durations ranging from nanoseconds to picoseconds. Q-switched lasers are highly efficient and can produce very high peak powers, making them ideal for many industrial and scientific applications. Another type of high intensity pulse laser is the mode-locked laser, which uses a nonlinear optical element, such as a saturable absorber or a passive mode locker, to generate short pulses. Mode-locked lasers can produce very short pulses, with pulse durations ranging from femtoseconds to picoseconds. They are highly stable and can produce very high peak powers, making them ideal for many scientific and research applications.

There are many factors that contribute to the performance and efficiency of a high intensity pulse laser, such as the gain medium, pump source, resonator design, and pulse generation method. The design and construction of a high intensity pulse laser can greatly impact its performance and suitability for a specific application. In an example, a high intensity pulse laser is a type of laser that produces a highly concentrated and focused beam of light with a high level of power and a very short pulse duration. It is used in a wide range of applications. In an example, the present invention provides a high intensity pulse laser generation system and related methods as described throughout the present specification and more specifically below.

FIG. 1 is a simplified diagram of a high intensity pulse laser generation system according to an example of the present. As shown, the system has an input laser that is configured with a first optical path, which begins with the laser input, reflects off a mirror, coupled to an actuator, and reflects off a curved mirror back to a vicinity of the input laser to reflect off a flat mirror to form a triangular path between two flat mirrors and a curved mirror. Further details of the first optical path are provided throughout the present specification and more particularly below.

In an example, an intensity of the input laser is added to increase an intensity level of the laser beam propagating in the triangular path from a first intensity level, a second intensity level, and so on to an Nth intensity level. The intensity is increased until a desired intensity level is achieved. Once the desired intensity level has been achieved, the actuator moves the flat mirror from a first position to a second position spatially to change the beam path from the first optical path to the second optical path. In an example, the second optical path changes a spatial location of a reflection point on the mirror coupled to the actuator to direct the beam from the mirror to a reflection point on the curved mirror to an outward path for a high intensity pulse laser beam. In an example, the high intensity pulse laser beam is multiple times an intensity of the input laser beam.

As shown, the system uses both high reflection flat and curved optical mirror devices with a reflectivity of more than 99.99% or 99.999% to minimize an optical loss. In an example, a high reflection optical mirror is a device that reflects light in a specific direction. The device has a flat or curved surface, coated with a high reflective material, such as dielectric materials, or, metal materials, e.g., aluminum, silver, or gold. The preferred high reflection optical mirror is a dielectric distributed Brag Reflector (DBR). In an example, the shape and curvature of the mirror determine the direction and intensity of the reflected light.

As shown, there are several types of high reflection optical mirrors, each with specific properties and uses. Flat mirrors, also known as plane mirrors, have a flat reflecting surface and are used to reflect light in a straight line. In an example, concave mirrors have a curved inward reflecting surface and are used to focus light to a single point. In an example, convex mirrors have a curved outward reflecting surface and are used to spread out light over a wider area. In an example, optical mirrors can also be coated with specialized coatings, such as dielectric coatings or metallic coatings, to enhance their reflective properties and reduce surface defects, which causes optical absorption resulting in optical damages. These coatings can improve the efficiency and performance of the mirror, making it suitable for a specific application.

As shown, the actuator is magneto-strictive actuator in an example. In an example, a magneto-strictive actuator is a device that uses the magnetostriction effect to produce a controlled movement or displacement. The actuator has a magneto-strictive material, such as iron, cobalt, or nickel, and a magnetic field source, such as a permanent magnet or an electromagnet. A preferred example of a magnetostriction material is shown in FIG. 1A and others.

When the magneto-strictive material is subjected to a magnetic field, it experiences a change in shape or dimensions, which results in a mechanical displacement. By controlling the strength and orientation of the magnetic field, the displacement of the magneto-strictive actuator can be precisely controlled. In a preferred example, magneto-strictive actuators have a number of properties that make them well-suited for fast actuation applications. They have a high response speed, low power consumption, and a high force-to-weight ratio, which allows them to produce large displacements with minimal input power. The response time of nanoseconds is much faster than that of milliseconds of piezo materials. In addition, magneto-strictive actuators have a high fatigue resistance and can operate over a wide temperature range, making them suitable for use in a variety of environments. Magneto-strictive actuators are highly reliable and can operate continuously without the need for maintenance, making them an attractive choice for many fast actuation applications.

In an example, various factors can impact the performance and efficiency of a magneto-strictive actuator, such as the type and composition of the magneto-strictive material, the design and strength of the magnetic field source, and the mechanical design of the actuator. The specific design and construction of a magneto-strictive actuator can impact its performance and suitability for a specific application.

In an example, the actuator is coupled to an electric coil to generate a magnetic field to spatially change the magneto-strictive material. In an example, an electric coil, also known as an inductor or a solenoid, is a device that generates a magnetic field when an electric current is passed through it. The coil is generally a length of wire, typically made of copper or aluminum, wound into a cylindrical or rectangular shape. The number of turns and the diameter of the wire determine the strength of the magnetic field produced by the coil. Various factors can impact the performance and efficiency of an electric coil, such as the type and size of the wire, the number of turns, and the shape of the coil. The specific design and construction of an electric coil can greatly impact its performance and suitability for a specific application.

In an example, the actuator also has a housing, inertial mass, and fixed screw for spatial adjustments. The actuator also has a magneto-strictive material that moves 0.01 to 2 mm, in an example, but can be other lengths. The material has a flat surface that is coupled directly to a backside of the mirror surface. In a preferred example, the flat surface is roughly equal in area as the backside surface of the mirror surface. The material can be affixed using a glue, or mechanically attached on the backside surface in other examples.

Figure 2:
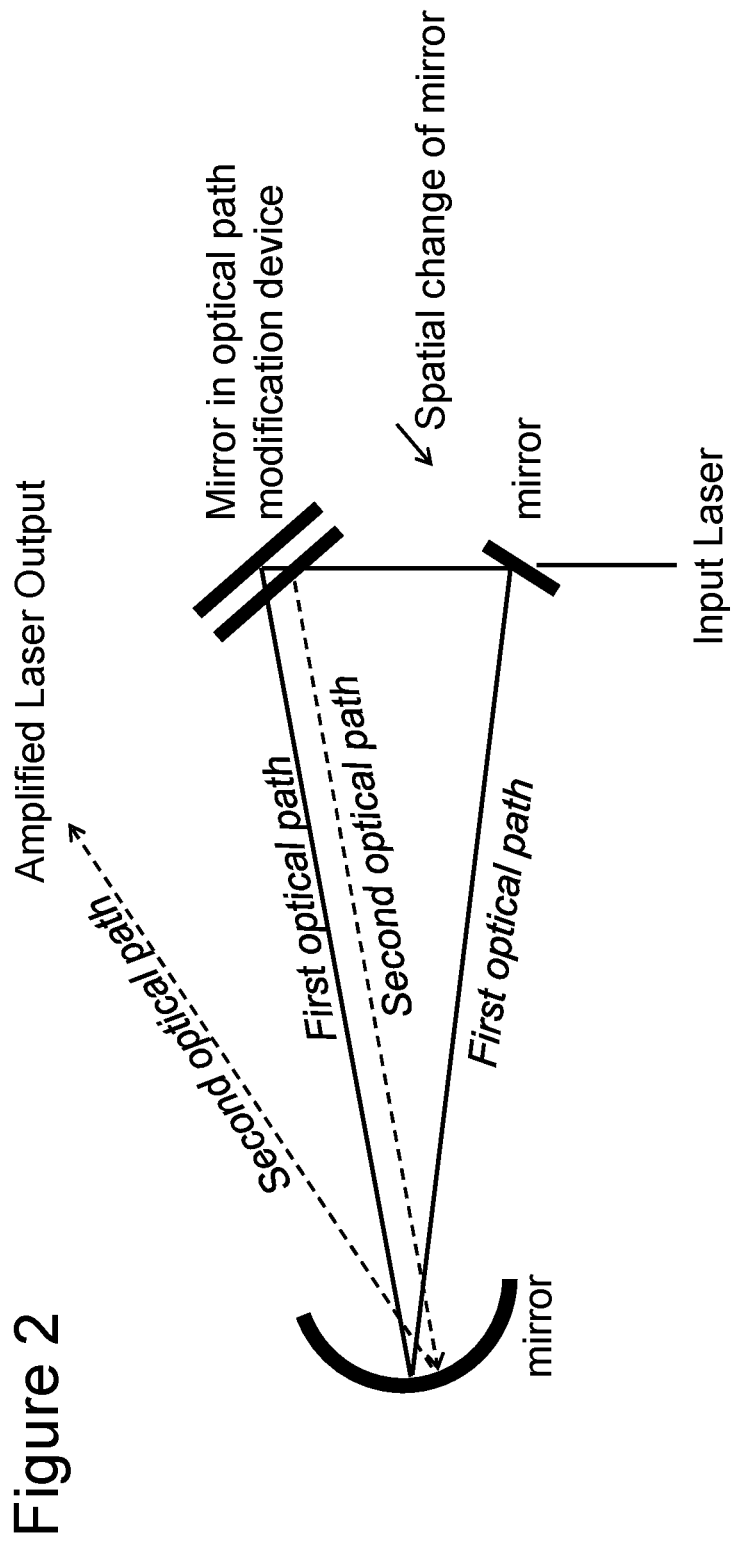
FIG. 2 is a detailed diagram of a multi path configuration for a high intensity pulse laser generation system according to an example of the present invention.

FIG. 2 is a detailed diagram of a multi path configuration for a high intensity pulse laser generation system according to an example of the present invention. As shown, the system has an input laser that is configured with a first optical path, which begins with the laser input, reflects off a mirror, coupled to an actuator, and reflects off a curved mirror back to a vicinity of the input laser to reflect off a flat mirror to form a triangular path between two flat mirrors and a curved mirror. Further details of the first optical path are provided throughout the present specification and more particularly below.

In an example, an intensity of the input laser is added to increase an intensity level of the laser beam propagating in the triangular path from a first intensity level, a second intensity level, and so on to an Nth intensity level. The intensity is increased until a desired intensity level is achieved. Once the desired intensity level has been achieved, the actuator moves the flat mirror from a first position to a second position spatially to change the beam path from the first optical path to the second optical path. In an example, the second optical path changes a spatial location of a reflection point on the mirror coupled to the actuator to direct the beam from the mirror to a reflection point on the curved mirror to an outward path for a high intensity pulse laser beam. In an example, the high intensity pulse laser beam is multiple times an intensity of the input laser beam. As shown and will be described, the various elements that make up a system for changing the beam direction from a first beam path to the second beam path are referred to as a cavity dumper. The term cavity dumper will be interpreted according to the specification, as well as meanings understood by one of ordinary skill in the art. Further details of a cavity dumper device are described in more detail below.

Figure 3:
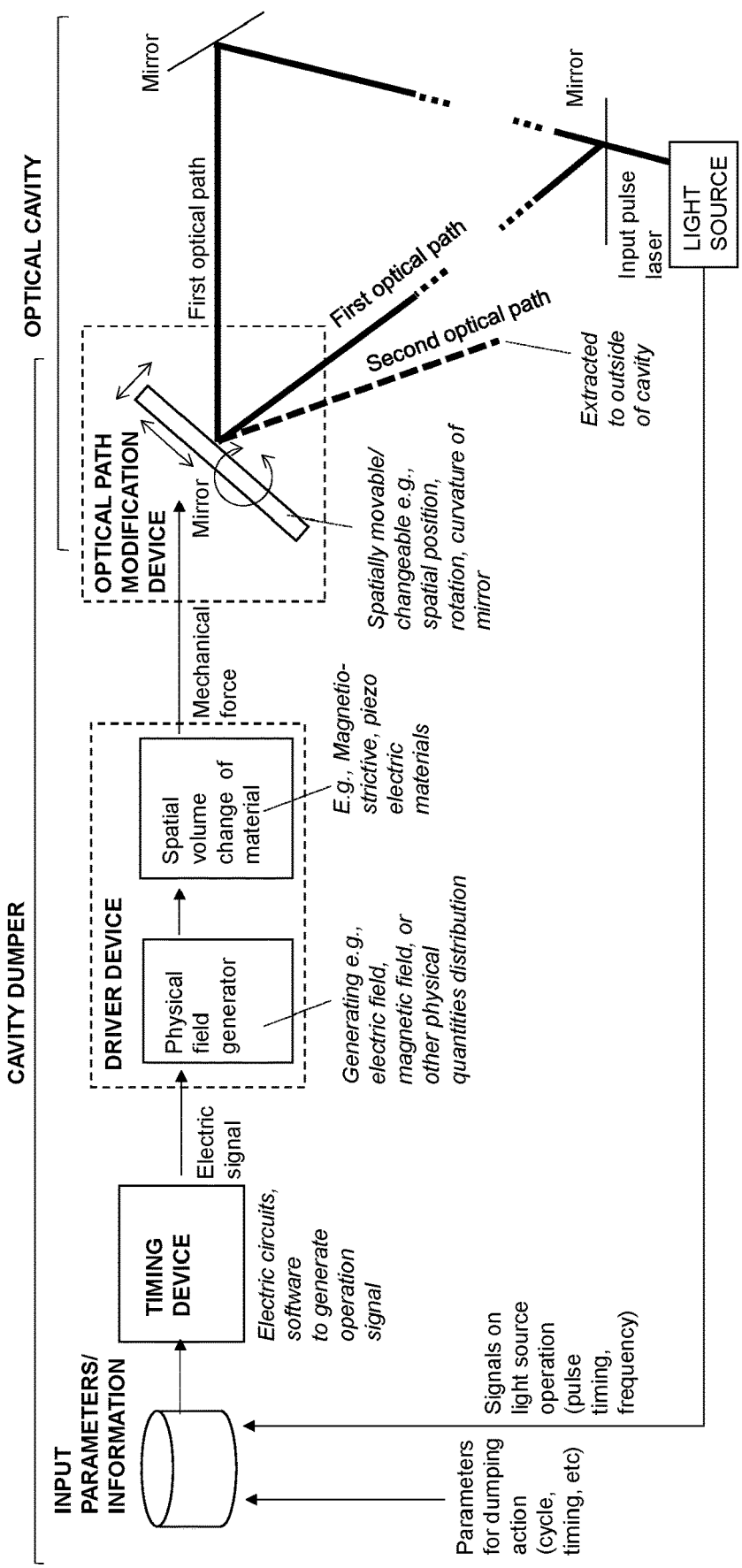
FIG. 3 is a detailed diagram of a cavity dumper for a high intensity pulse laser generation system according to an example of the present invention.

FIG. 3 is a detailed diagram of a cavity dumper for a high intensity pulse laser generation system according to an example of the present invention. As shown, the cavity dumper includes various elements including input parameters and information, a timing device, a driver device (e.g., spatial driver device), and an optical path modification device, although there may be variations. The optical path modification device is coupled to a movable mirror, a curved mirror, and a flat mirror, as shown. The spatial region configured between the mirrors creates an optical cavity, as shown. The optical cavity includes the first optical path, which generates a high intensity laser beam, and a second optical path, which outputs a high intensity pulse laser beam. The second optical path is outside of the optical cavity, as shown. In an example, the second optical path can be directed to a target. The target can be another mirror device, a particle for a reactor, a material to be processed, a moving target, e.g., vehicle, warship, drone, rocket, nuclear warhead, or any other object, whether artificial or natural or a combination thereof.

As shown, information and/or feedback from the light source are fed into a processing platform. The processing platform can be a suitable computer-based processor, controller, or other type of processor. Examples of feedback can include signals from the light source and the photodiodes to detect the transmitted light from the backside of each mirror which are not shown in FIG. 3, including pulse timing, frequency, power output, and other parameters. Parameters for cycling the mirror device are also fed into the processing platform. The processing platform further includes storage, such as volatile and non-volatile memory, including dynamic random-access memory, flash memory, static random-access memory, fixed memory devices, hard drives, and any combination of electronic and/or optical memory devices.

The information from the processing platform is fed into a timing device. The timing device is configured with a clock signal, which is configured with the information, to generate an electronic signal or signals for the driver device. The driver device includes a physical field generator that generates, for example, a magnetic field or an electric field to cause a spatial change of a spatial region in a material such as a magneto-strictive, piezo electric, or other material to output mechanical force to move a spatial position of a movable mirror. The movement of the spatial position of the mirror causes the laser beam to change from the first optical path to the second optical path, or any other optical path. In an example, the driver device can be called a spatial driver device since it drives a mechanical member in free space.

Figure 4:
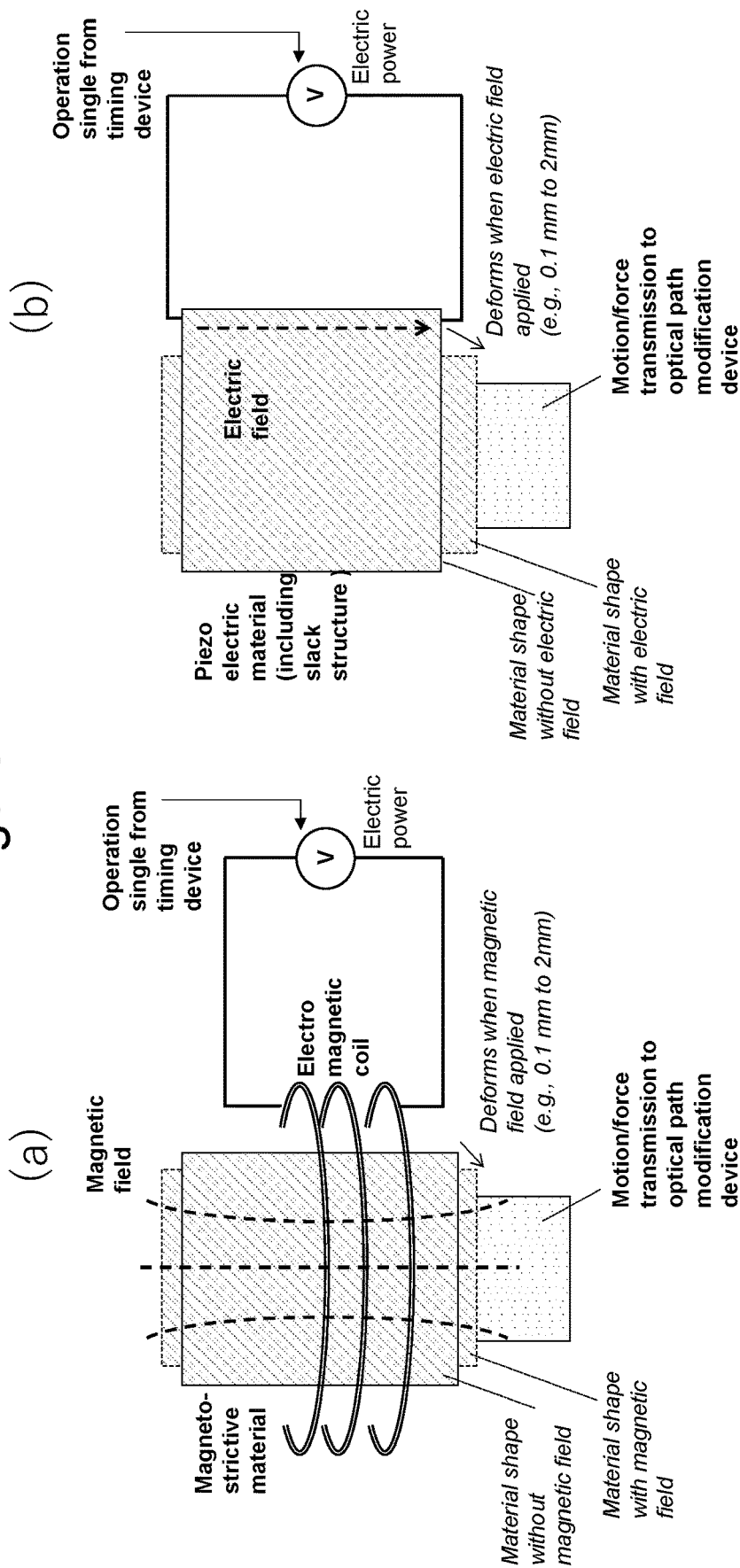
FIG. 4 is a detailed diagram of a driver device for a cavity dumper in an example of the present invention.

FIG. 4 is a detailed diagram of a driver device for a cavity dumper in an example of the present invention. As shown under FIG. 4(a) is a magneto-strictive material configured with an electric power source. The electric power source is coupled to a timing device. The power is fed through coils to generate a magnetic field. The magnetic field changes a shape of the magneto-strictive material form a first state to a second state, which elongates the material (or contracts the materials depending on the configuration of system), and causes mechanical force to move an exterior region coupled to a mirror device from a first spatial region to a second spatial region. As shown under FIG. 4(b) is a piezo electric material configured with an electric power source. The electric power source is coupled to a timing device. The electric power is fed to the material to generate an electric field. The electric field changes a shape of the piezo electric material form a first state to a second state, which elongates the material, and causes mechanical force to move an exterior region coupled to a mirror device from a first spatial region to a second spatial region.

Figure 5:
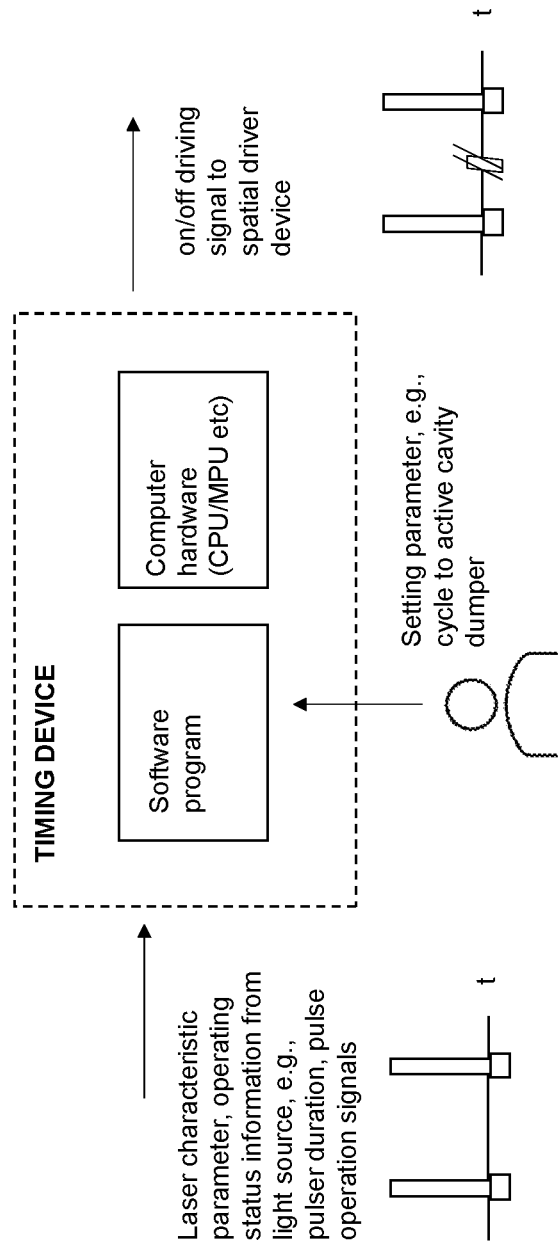
FIG. 5 is a detailed diagram of a timing device for a cavity dumper in an example of the present invention.

FIG. 5 is a detailed diagram of a timing device for a cavity dumper in an example of the present invention. As shown, the timing device receives inputs of, for example, laser characteristics, such as operating status, pulse duration, pulse operation, frequency, and other information. The timing device includes a software program, which is programmable, and computer hardware, among other elements. The timing devices outputs an on/off signal from the driver device to the magneto-strictive material or other material in an example.

In an example, a computer for controlling a drive, which is a high speed driver, also known as a "drive computer," is a specialized device that is used to control and monitor the operation of a high speed driver, such as the actuator. In an example, the drive computer typically includes a microprocessor or microcontroller, which is a type of central processing unit (CPU) that is responsible for controlling the operation of the drive. The drive computer also includes input/output (I/O) interfaces, which allow it to receive input signals from sensors or other devices and to output control signals to the drive. In an example, the drive computer may also include memory for storing data and instructions, as well as various other hardware and software components that enable it to perform its functions. Some drive computers may also include additional features, such as communication interfaces for communicating with other devices or systems, or built-in diagnostic tools for monitoring and troubleshooting the drive. Further details of the present system and method are described below.

Figure 6:
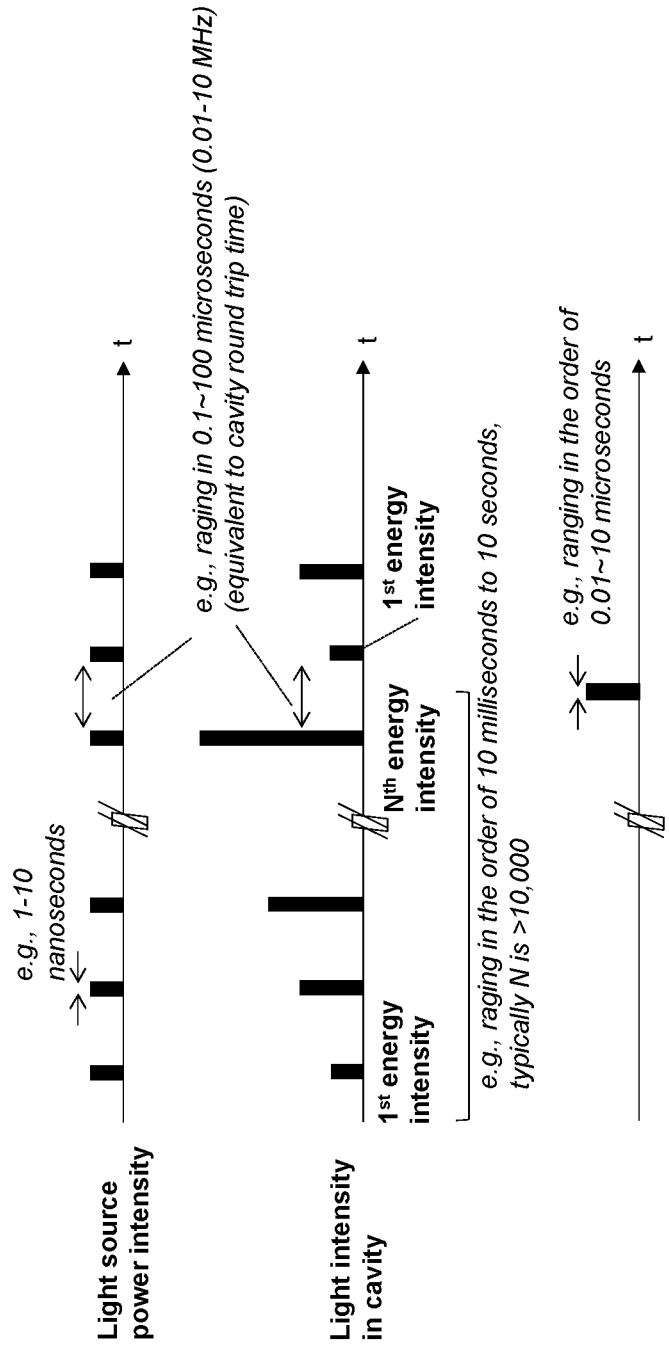
FIG. 6 is a timing diagram for generating a high intensity pulse laser in an example of the present invention.

FIG. 6 is a timing diagram for generating a high intensity pulse laser in an example of the present invention. As shown in the first line labelled "Light source power intensity," each laser pulse from the light source has a pulse in a nanosecond range, e.g., 1-10 nanoseconds. Light intensity in the cavity increases in intensity with each pulse from the source from a first energy intensity, a second energy intensity, to an Nth energy intensity, where N is 10,000 or greater, but can be fewer or more depending upon the application. Once the high intensity pulse is dumped or redirected to a second path, the process continues from the beginning with a first energy intensity, a second energy intensity to an Nth energy intensity. The cavity dumper action to dump laser beam after Nth energy intensity is achieved is illustrate on the bottom line, which shows a pulse ranging in a 0.01 to 10 microseconds range, but can be others. The laser beam that is dumped is a high intensity pulse laser that has a much higher intensity than the original intensity from the laser light source.

In an example, the present high intensity pulse laser system can be configured with a laser fusion system for generating energy. As an example, laser fusion is a process that uses lasers to initiate and sustain a nuclear fusion reaction, which is a process that releases energy by combining atomic nuclei. This process has the potential to provide a virtually limitless and clean source of energy. In laser fusion, a beam of high-energy lasers is used to create a plasma, which is a hot, ionized gas that is composed of free electrons and atomic nuclei. The plasma is then compressed and heated to extremely high temperatures and pressures, causing the atomic nuclei to fuse together and release energy. An example of laser fusion is inertial confinement fusion (ICF). In ICF, a laser beam is used to create a shock wave that compresses a small pellet of fusion fuel. Further details of laser fusion are described in more detail below.

Figure 7:
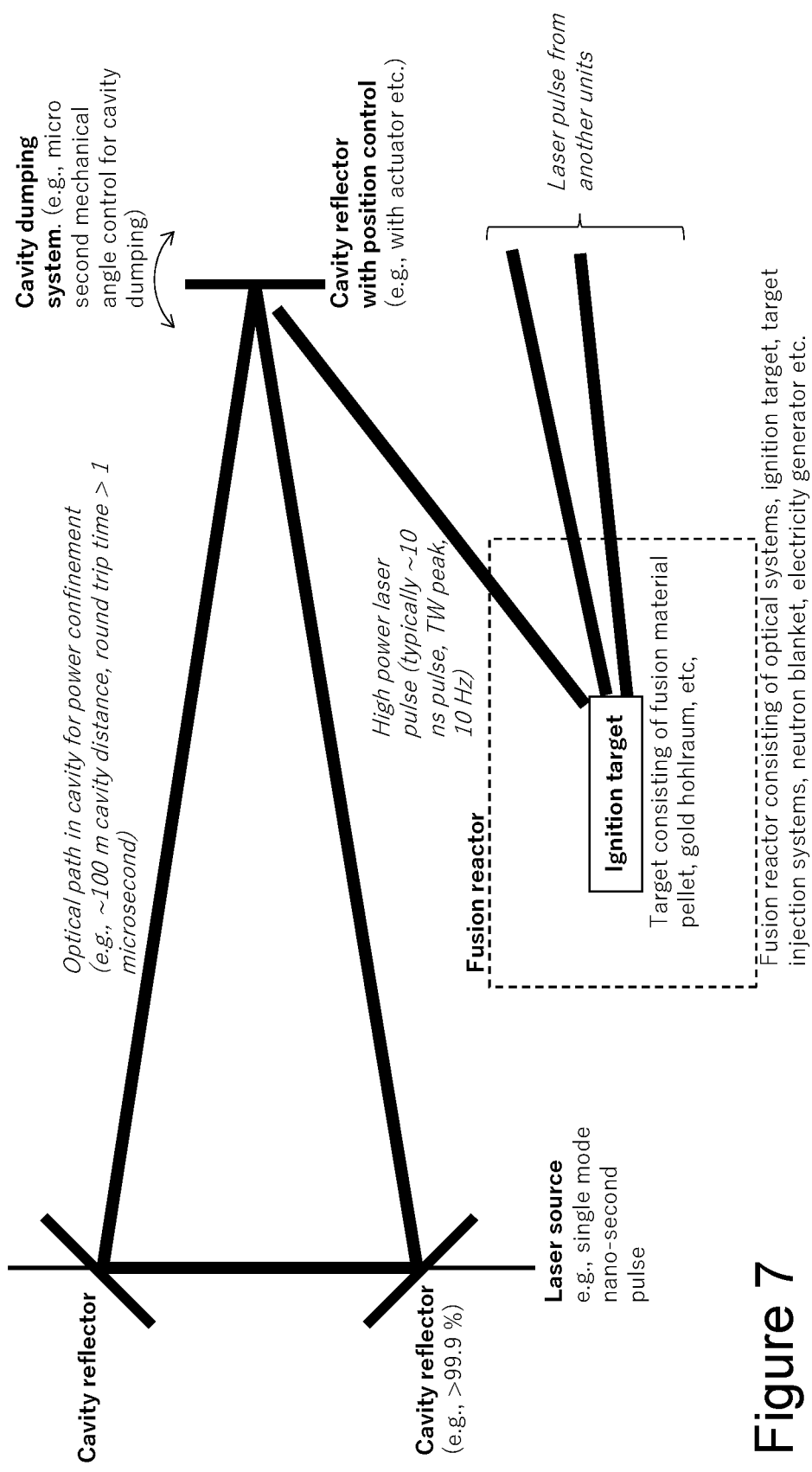
FIG. 7 is a simplified diagram illustrating a fusion system configured to a high intensity pulse laser system according to an example of the present invention.

FIG. 7 is a simplified diagram illustrating a fusion system configured to a high intensity pulse laser system according to an example of the present invention. As shown, the fusion system has a fusion material, e.g., pellet, configured within a reactor. The fusion system can be configured with multiple lasers from different sources.

FIGS. 8 to 10 illustrate timing diagrams showing a high intensity pulse laser output according to examples of the present invention. As show in an example of FIG. 8, a one (1) Mega Joule class laser source is included. The laser source is configured for, for example, 1060 nm but can be other wavelengths. The laser pulse has a length of ten (10) nanoseconds. The cycle is ten (10) micro seconds (or 100 kHz). In an example, one hundred thousand (100,000) cycles or round trips are generating in a cavity according to the present invention. The cavity length is, for example, 1.5 kilometer equating to a round trip cavity length of three (3) kilometers. The round trip time is ten (10) micro seconds, and one seconds creates one hundred thousand round trips. For the one hundred thousand round trips, we generate $1 \times 10^{12}$ Watts (or 1 Terra Watt) or ten (10) Kilo Joules of pulse energy at one (1) Hz. When one hundred laser beams are used together for a fusion reactor, one Mega Joule is achieved.

As show in an example of FIG. 9, a one (1) Mega Joule class laser source is included. The laser source is configured for, for example, 1060 nm but can be other wavelengths. The laser pulse has a length of ten (10) nanoseconds. The cycle is one (1) micro second (or 1 MHZ). In an example, one hundred thousand (100,000) cycles or round trips are generating in a cavity according to the present invention. The cavity length is, for example, one hundred fifty (150) meters equating to a round trip cavity length of three hundred (300) meters. The round trip time is one (1) micro second, and one tens (1/10) of a second creates one hundred thousand round trips. For the one hundred thousand round trips, we generate $1 \times 10^{12}$ Watts (or 1 Terra Watt) or ten (10) Kilo Joules of pulse energy at ten (10) Hz. When one hundred laser beams are used together for a fusion reactor, one Mega Joule is achieved. For continuous laser fusion or commercially available laser fusion, Mega Joule pulse is required at 10 Hz repetition rate in an example. Using present invention, it is possible to make the Mega Joule pulse with the repetition rate of 10 Hz by using a laser source with 100 mJ of pulse energy and 1 MHz repetition rate. Presently, Lawrence Livermore National laboratory could generate only one pulse with a Mega Joule energy per day.

As show in an example of FIG. 10, a commercially available class laser source ($0.5 \times 10^6$ W) is included. The laser source is configured for, for example, 1060 nm but can be other wavelengths. The laser pulse has a length of ten (10) nanoseconds. The cycle is one (1) micro seconds (or 1 MHz). In an example, one hundred thousand (100,000) cycles or round trips are generating in a cavity according to the present invention. The cavity length is, for example, one hundred fifty (150) meters equating to a round trip cavity length of three hundred (300) meters. The round-trip time is one (1) micro second, and one tens of a second creates one hundred thousand round trips. For the one hundred thousand round trips, we generate $0.05 \times 10^{12}$ Watts (or 0.05 Terra Watt) or five hundred (500) Joules of pulse energy at 10 Hz. When two hundred laser beams are used together for a fusion reactor, one tenth (0.1) Mega Joule is achieved.

In an example, the present invention provides a high intensity pulse laser generation system. The system has a variety of elements. The system has an optical cavity maintained in a vacuum of 300 Torr and less and characterized by a length of free space, e.g., 50 meters to 10 kilometers and others. In an example, the optical cavity is configured to increase an intensity of a laser beam comprising a pulse from a first energy power intensity to a second higher energy power intensity propagating on a first optical path configured within the optical cavity by circulating or reciprocating at least a portion of the laser beam. The laser beam is from a light source having a pulse energy power (e.g., 0.01 Joule to 1 Mega Joule) on the first optical path.

In an example, the system has an optical path modification device coupled to the optical cavity. In an example, the optical path modification device is configured to repeatedly change a spatial direction of the laser beam propagating on the first optical path at a predetermined timing ranging from 20 milliseconds to 3 seconds, for example, with the response time from 0.01 microsecond to 30 microseconds, for example. The change in spatial direction causes the laser beam propagating on the first optical path to change a direction from the first optical path to a second optical path that is outside of the first optical path such that the optical path modification device is configured to propagate the laser beam on the second optical path generating a high intensity pulse laser beam. The system has at least a pair of mirror devices. Each of the mirror devices has a mirror surface area, e.g., 1 cm$^2$ to 10000 cm$^2$. The pair of mirror devices are configured with the optical path modification device and provided within the first optical path. At least one the mirror devices is configured to change a spatial position of the mirror device being coupled to the laser beam. Also, these mirrors are high reflection mirrors with a reflectivity of more than 99.99% or 99.999%. Preferred high reflection mirrors are dielectric DBR.

In an example, the system has a timing device configured with the optical path modification device and having a predetermined frequency to adjust the spatial position of the mirror device. The timing device is configured to adjust the spatial position of the mirror device after a predetermined number of cycles associated with the circulating or reciprocating of the laser beam propagating between at least the pair of mirrors such that each cycle of the laser beam progressively increases an intensity from the first energy power intensity to the second energy power intensity to an Nth energy power intensity, where N is an integer greater than 2, to the high intensity pulse laser beam on the second optical path.

In an example, the magneto-strictive material is in mechanical contact with a backside of the mirror devices that is adjusted or monolithically integrated with the backside of the mirror device. In an example, the mechanical contact is made using a surface region of the magneto-strictive material and a backside of the mirror device, the mechanical contact between the surface region of the magneto-strictive material and the backside surface of the mirror are substantially matched in area.

In an example, the change of thickness of the volume structure is spatially changed along a plane of the magneto-strictive material parallel to and facing a backside of the mirror device by modulating a magnetic field spatially with and coupled to the magnetic strictive material such that the mirror device is configured to tilt from a first angle to a second angle measured from a direction normal to the mirror surface area of the mirror device. In an example, the first angle to the second angle ranges from 0.01 degree to 5 degrees, but can be others.

In an example, the thickness of the volume structure of the magneto-strictive material is changed from a first thickness to a second thickness along an entire volume provided between a first surface region and a second surface region of the magneto-strictive material. The magneto-strictive material is coupled to a backside of the mirror device, and by applying a uniform magnetic field to the magnetic strictive material, the mirror device changes a position of the laser beam from the first optical path to the second optical path by changing a spatial location of an incidence of the laser beam on the mirror device from a first location of the mirror surface area to a second location of the mirror surface area.

In an example, the pair of mirrors comprise, respectively, a first flat mirror device and a curved mirror device, the flat mirror being adjusted with the magneto-strictive material, and the curved mirror device is configured with the first mirror device to change the direction of the laser beam from the first optical path to the second optical path. In an example, each of the mirror devices has a reflectance to the laser beam of 99.99% or more. In an example, each of the mirror devices comprises a dielectric multilayer mirror surface that includes an oxide compound, or a fluorine compound, e.g., calcium fluoride, magnesium fluoride, lithium fluoride, lanthanum fluoride, yttrium fluoride.

In an example, the laser beam can have various wavelength ranges. The laser beam has a wavelength range from 1020 nm to 1070 nm, but can be others. In an example, the laser beam from the light source is a single-mode laser or consists of a single mode laser. In an example, the light source comprises a semiconductor laser light source containing an AlInGaN-based compound. The pulse intensity of laser beam generated is at least 103 times greater than a pulse intensity of the laser beam from the light source.

In an example, the optical path modification device changes an orientation of the mirror device in a time of less than 2 microseconds, or others. The laser beam from the light source comprises a pulsed laser with a frequency of more than 100 kHz, but can have other ranges.

In an example, the present invention provides a high intensity pulse laser generation system. The invention has an optical cavity maintained in a vacuum of 300 Torr and less and characterized by a length of free space of 50 meters to 10 kilometers. In an example, the optical cavity is configured to increase an intensity of a laser beam comprising a pulse from a first energy power intensity to a second higher energy power intensity propagating on a first optical path configured within the optical cavity by circulating or reciprocating at least a portion of the laser beam from a light source having a output power of 0.01 Joule to 1 Mega Joule on the first optical path.

In an example, the system has an optical path modification device coupled to the optical cavity. In an example, the optical path modification device is configured to repeatedly change a spatial direction of the laser beam propagating on the first optical path at a predetermined timing ranging from 20 milliseconds to 3 seconds with the response time from 0.01 microsecond to 30 microseconds to cause the laser beam propagating on the first optical path to change a direction from the first optical path to a second optical path that is outside of the first optical path thereby the optical path modification device is configured to propagate the laser beam on the second optical path generating a high intensity pulse laser beam.

In an example, the system has at least a pair of mirror devices, each of the mirror devices having a mirror surface area of 1 $cm^2$ and 10000 $cm^2$. In an example, the system has configured with the optical path modification device and provided within the first optical path, at least one the mirror devices configured to change a spatial position of the mirror device being coupled to the laser beam.

In an example, the system has a timing device configured with the optical path modification device and having a predetermined frequency to adjust the spatial position of the mirror device. In an example, the timing device is configured to adjust the spatial position of the mirror device after a predetermined number of cycles associated with the circulating or reciprocating of the laser beam propagating between at least the pair of mirrors such that each cycle of the laser beam progressively increases an intensity from the first energy power intensity to the second energy power intensity to an Nth energy power intensity, where N is an integer greater than 2, to the high intensity pulse laser beam on the second optical path.

In an example, the system has a spatial driver device comprising a magneto-strictive material or a piezo electric material. In an example, the spatial driver device is coupled to the timing device and the one mirror device. In an example, the spatial driver device is configured to adjust the spatial position of the mirror device by changing a thickness of a volume structure ranging from 0.01 mm to 2 mm including the magneto-strictive material or the piezo electric material of the spatial driver device by an expansion or contraction process to move the spatial position of the mirror device from a first position to a second position after the predetermined number of cycles.

In an example, the change of thickness of the volume structure is spatially changed along a plane of the magneto-strictive material or the piezo electric material parallel to and facing a backside of the mirror device by modulating a magnetic field spatially with and coupled to the magnetic strictive material or by modulating an electric field spatially with and coupled to the piezo electric material. The mirror device is configured to tilt from a first angle to a second angle measured from a direction normal to the mirror surface area of the mirror device; wherein the first angle to the second angle ranges from 0.1 degree to 5 degrees.

In an example, the thickness of the volume structure of the magneto-strictive material or the piezo electric material is changed from a first thickness to a second thickness along an entire volume provided between a first surface region and a second surface region of the magneto-strictive material or the piezo electric material coupled to a backside of the mirror device by applying a uniform electric magnetic field to the magnetic strictive material or electric field to the piezo electric material such that the mirror device changes a direction of the laser beam from the first optical path to the second optical path by changing a spatial location of an incidence of the laser beam on the mirror device from a first location of the mirror surface area to a second location of the mirror surface area.

In an example, the invention provides a high intensity pulse laser generation system. The system provides an optical cavity maintained in a vacuum of 300 Torr and less and is characterized by a length of free space of 50 meters to 10 kilometers, but can be others. In an example, the optical cavity is configured to increase an intensity of a laser beam comprising a pulse from a first energy power intensity to a second higher energy power intensity propagating on a first optical path configured within the optical cavity by circulating or reciprocating at least a portion of the laser beam from a light source having an output power of 0.01 Joule to 1 Mega Joule on the first optical path. In an example, the system has an optical path modification device coupled to the optical cavity. In an example, the optical path modification device is configured to repeatedly change a spatial direction of the laser beam propagating on the first optical path at a predetermined timing ranging from 20 milliseconds to 3 seconds with the response time from 0.01 microsecond to 30 microseconds, and others. The change in spatial direction causes the laser beam propagating on the first optical path to change a direction from the first optical path to a second optical path that is outside of the first optical path thereby the optical path modification device is configured to propagate the laser beam on the second optical path generating a high intensity pulse laser beam, In an example, the system has at least a pair of mirror devices. Each of the mirror devices has a mirror surface area of 10 cm$^2$ and 10000 cm$^2$, and configured with the optical path modification device and provided within the first optical path. At least one the mirror devices is configured to change a spatial position of the mirror device being coupled to the laser beam.

In an example, the system has a timing device configured with the optical path modification device and having a predetermined frequency to adjust the spatial position of the mirror device. The timing device is configured to adjust the spatial position of the mirror device after a predetermined number of cycles associated with the circulating or reciprocating of the laser beam propagating between at least the pair of mirrors such that each cycle of the laser beam progressively increases an intensity from the first energy power intensity to the second energy power intensity to an Nth energy power intensity, where N is an integer greater than 2, to the high intensity pulse laser beam on the second optical path.

In an example, the system has a spatial driver device comprising a magneto-strictive material. The spatial driver device is coupled to the timing device and the one mirror device. The spatial driver device is configured to adjust the spatial position of the mirror device by changing a thickness of a volume structure ranging from 0.01 mm to 2 mm including the magneto-strictive material of the spatial driver device by an expansion or contraction process to move the spatial position of the mirror device from a first position to a second position after the predetermined number of cycles.

In an example, each of the mirror devices comprises a deformable mirror surface. The deformable mirror can be configured with a MEMS device, a piezoelectric driver, or other actuation devices. In an example, the deformable mirror is adjusted to correct for optical anomalies, caused by non-uniformities in the optics or other portions of an optical system. The optical anomalies can also be caused in part by thermal, electrical, mechanical, or other internal or external influences. In an example, the deformable mirror surface corrects an optical characteristic of the laser beam to efficiently and reliably output a high intensity pulse laser beam.

In an example, the laser device or system can be a suitable device with desired wavelength and power characteristics. In an example, the laser source can be an excimer laser, a diode-pumped solid-state laser (DPSSL), or a flashlamp-pumped glass laser, or a solid state diode laser, or a fiber laser.

While the above is a full description of the specific examples, various modifications, alternative constructions and equivalents may be used. As an example, the packaged device can include any combination of elements described above, as well as outside of the present specification. Therefore, the above description and illustrations should not be taken as limiting the scope of the present invention which is defined by the appended claims.

The invention claimed is:

1. A high intensity pulse laser generation system, the system comprising:
    an optical cavity, the optical cavity being configured to increase an intensity of a laser beam comprising a pulse from a first energy power intensity to a second higher energy power intensity propagating on a first optical path configured within the optical cavity by circulating or reciprocating at least a portion of the laser beam from a light source having a pulse energy power of 0.01 Joule to 1 Mega Joule on the first optical path;
    an optical path modification device coupled to the optical cavity, the optical path modification device configured to repeatedly change a spatial direction of the laser beam propagating on the first optical path at a predetermined timing to cause the laser beam propagating on the first optical path to change a direction from the first optical path to a second optical path that is outside of the first optical path thereby the optical path modification device is configured to propagate the laser beam on the second optical path generating a high intensity pulse laser beam;
    at least a pair of mirror devices, each of the mirror devices having a mirror surface area of 1 cm2 and 10000 cm2, and configured with the optical path modification device and provided within the first optical path, at least one the mirror devices configured to change a spatial position of the mirror device being coupled to the laser beam;
    a timing device configured with the optical path modification device and having a predetermined frequency to adjust the spatial position of the mirror device, the timing device being configured to adjust the spatial position of the mirror device after a predetermined number of cycles associated with the circulating or reciprocating of the laser beam propagating between at least the pair of mirrors such that each cycle of the laser beam progressively increases an intensity from the first energy power intensity to the second energy power intensity to an Nth energy power intensity, where N is an integer greater than 2, to the high intensity pulse laser beam on the second optical path;
    an spatial driver device coupled to the timing device and the one mirror device, the spatial driver device being configured to adjust the spatial position of the mirror device by changing a thickness of a volume structure by an expansion or contraction process to move the spatial position of the mirror device from a first position to a second position after the predetermined number of cycles.

2. The system of claim 1 wherein the spatial driver device comprising a magneto-strictive material that is in mechanical contact with a backside of the mirror devices that is adjusted or monolithically integrated with the backside of the mirror device.

3. The system of claim 2 wherein the mechanical contact is made using a surface region of the magneto-strictive material and a backside of the mirror device, the mechanical contact between the surface region of the magneto-strictive material and the backside surface are substantially matched in area.

4. The system of claim 2 wherein the change of thickness of the volume structure is spatially changed along a plane of the magneto-strictive material parallel to and facing a backside of the mirror device by modulating a magnetic field spatially with and coupled to the magnetic strictive material such that the mirror device is configured to tilt from a first angle to a second angle measured from a direction normal to the mirror surface area of the mirror device.

5. The system of claim 1 wherein the spatial driver device is configured to move the mirror device.

6. The system of claim 1 wherein the pair of mirrors comprise, respectively, a first flat mirror device and a second mirror device, the flat mirror being adjusted with the magneto-strictive material, and the second mirror device is configured with the first mirror device to change the direction of the laser beam from the first optical path to the second optical path.

7. The system of claim 6 wherein the second mirror device is a curved mirror device.

8. The system of claim 1 wherein the laser beam has a wavelength range from 1020 nm to 1070 nm.

9. The system of claim 1 wherein the optical path modification device changes an orientation of the mirror device in a time of less than 2 microseconds.

10. The system of claim 1, wherein each of the mirror devices has a reflectance to the laser beam of 99.9% or more.

11. The system of claim 1 wherein each of the mirror devices comprises a dielectric multilayer mirror surface that includes a fluorine compound.

12. The system of claim 1 wherein the laser beam from the light source comprises a pulsed laser with a frequency of more than 100 kHz.

13. The system of claim 1 wherein the laser beam from the light source is a single-mode laser.

14. The system of claim 1 wherein the light source comprises a semiconductor laser light source containing an AlInGaN-based compound.

15. The system of claim 1 wherein the pulse intensity of laser beam generated is at least $10^3$ times greater than a pulse intensity of the laser beam from the light source.

16. A high intensity pulse laser generation system, the system comprising:
an optical cavity maintained in a vacuum, the optical cavity being configured to increase an intensity of a laser beam comprising a pulse from a first energy power intensity to a second higher energy power intensity propagating on a first optical path configured within the optical cavity by circulating or reciprocating at least a portion of the laser beam from a light source on the first optical path;
an optical path modification device coupled to the optical cavity, the optical path modification device configured to repeatedly change a spatial direction of the laser beam propagating on the first optical path at a predetermined timing ranging from 20 milliseconds to 3 seconds with the response time from 0.01 microsecond to 30 microseconds to cause the laser beam propagating on the first optical path to change a direction from the first optical path to a second optical path that is outside of the first optical path thereby the optical path modification device is configured to propagate the laser beam on the second optical path generating a high intensity pulse laser beam;
at least a pair of mirror devices, each of the mirror devices having a mirror surface area of 1 cm2 and 10000 cm2, and configured with the optical path modification device and provided within the first optical path, at least one the mirror devices configured to change a spatial position of the mirror device being coupled to the laser beam;
a timing device configured with the optical path modification device and having a predetermined frequency to adjust the spatial position of the mirror device, the timing device being configured to adjust the spatial position of the mirror device after a predetermined number of cycles associated with the circulating or reciprocating of the laser beam propagating between at least the pair of mirrors such that each cycle of the laser beam progressively increases an intensity from the first energy power intensity to the second energy power intensity to an Nth energy power intensity, where N is an integer greater than 2, to the high intensity pulse laser beam on the second optical path; and
a driver device coupled to the timing device and the one mirror device, the driver device being configured to adjust the spatial position of the mirror device to move the spatial position of the mirror device from a first position to a second position after the predetermined number of cycles.

17. The system of claim 16 wherein the adjustment in spatial position is provided such that the mirror device is configured to tilt from a first angle to a second angle measured from a direction normal to the mirror surface area of the mirror device; wherein the first angle to the second angle ranges from 0.1 degree to 5 degrees.

18. The system of claim 16 wherein the adjustment of the spatial position is provided such that the mirror device changes a direction of the laser beam from the first optical path to the second optical path by changing a spatial location of an incidence of the laser beam on the mirror device from a first location of the mirror surface area to a second location of the mirror surface area.

19. A method of high intensity pulse laser generation system, the system comprising:
in an optical cavity configured to increase an intensity of a laser beam comprising a pulse from a first energy power intensity to a second higher energy power intensity propagating on a first optical path configured within the optical cavity by circulating or reciprocating at least a portion of the laser beam from a light source having a output power of 0.01 Joule to 1 Mega Joule on the first optical path coupled to an optical path modification device coupled to the optical cavity, the optical path modification device configured to repeatedly change a spatial direction of the laser beam propagating on the first optical path at a predetermined timing to cause the laser beam propagating on the first optical path to change a direction from the first optical path to a second optical path that is outside of the first optical path thereby the optical path modification device is configured to propagate the laser beam on the second optical path generating a high intensity pulse laser beam and at least a pair of mirror devices configured with the optical path modification device and provided within the first optical path, at least one the mirror devices configured to change a spatial position of the mirror device being coupled to the laser beam;

adjusting the spatial position of the mirror device using a timing device after a predetermined number of cycles associated with the circulating or reciprocating of the laser beam propagating between at least the pair of mirrors such that each cycle of the laser beam progressively increases an intensity from the first energy power intensity to the second energy power intensity to an Nth energy power intensity, where N is an integer greater than 2, to the high intensity pulse laser beam on the second optical path.

20. The method of claim 19 wherein at least one of the mirror devices comprises a deformable mirror surface.

* * * * *